US010916800B2

(12) United States Patent
Jan et al.

(10) Patent No.: US 10,916,800 B2
(45) Date of Patent: Feb. 9, 2021

(54) APPARATUS OF REACTIVE CATHODIC ARC EVAPORATOR FOR PLATING LITHIUM-COMPOUND THIN FILM AND METHOD THEREOF

(71) Applicant: Institute of Nuclear Energy Research, Atomic Energy Council, Executive Yuan, R.O.C., Taoyuan (TW)

(72) Inventors: Der-Jun Jan, Taoyuan (TW); Yuh-Jenq Yu, Taoyuan (TW); Tien-Hsiang Hsueh, Taoyuan (TW); Tien-F Ko, New Taipei (TW)

(73) Assignee: Institute of Nuclear Energy Research, Atomic Energy Council, Executive Yuan, R.O.C., Taoyuan (TW)

( * ) Notice: Subject to any disclaimer, the term of this patent is extended or adjusted under 35 U.S.C. 154(b) by 61 days.

(21) Appl. No.: 16/241,314

(22) Filed: Jan. 7, 2019

(65) Prior Publication Data

US 2020/0220203 A1    Jul. 9, 2020

(51) Int. Cl.
| | |
|---|---|
| *C23C 14/56* | (2006.01) |
| *H01M 10/0525* | (2010.01) |
| *C23C 14/32* | (2006.01) |
| *H01J 37/32* | (2006.01) |

(52) U.S. Cl.
CPC ....... *H01M 10/0525* (2013.01); *C23C 14/325* (2013.01); *C23C 14/56* (2013.01); *H01J 37/32064* (2013.01); *H01J 2237/3321* (2013.01)

(58) Field of Classification Search
CPC ........... H01J 37/32055; H01J 37/32064; H01J 2237/3321; C23C 14/325; C23C 14/24; C23C 14/08; C23C 14/56; H01M 10/525
USPC ......................... 204/192.38, 298.41; 427/580
See application file for complete search history.

(56) References Cited

U.S. PATENT DOCUMENTS

| | | | | |
|---|---|---|---|---|
| 5,413,684 A | * | 5/1995 | Bergmann | .......... C23C 14/0021 204/192.12 |
| 5,662,741 A | * | 9/1997 | Ehrich | .................... C23C 14/32 118/723 HC |
| 7,300,559 B2 | * | 11/2007 | Gorokhovsky | ....... C23C 14/022 204/192.38 |
| 2013/0164459 A1 | * | 6/2013 | Nieh | ..................... C23C 14/505 427/850 |
| 2016/0336583 A1 | * | 11/2016 | Smith | ................. C23C 14/0676 |

* cited by examiner

*Primary Examiner* — Rodney G McDonald
(74) *Attorney, Agent, or Firm* — Demian K. Jackson; Jackson IPG PLLC

(57) ABSTRACT

An apparatus is provided for plating a lithium (Li)-compound thin film. In the thin film, Li is obtained through thermal evaporation, and titanium (Ti) or other metal by using arc plasma. The elements converted into gas phase are co-deposited in a plasma environment with a reaction gas (oxygen) to be activated as excited atoms or molecules for reaction. In the end, all of the constituent elements are deposited on a substrate to form the Li-compound thin film. Thus, reaction efficiency is high with a fast deposition rate. The composition ratio of each element is independently determined to control its yield according to the requirement. Hence, the present invention greatly enhances the fabrication rate with lowered production cost for applications in the thin-film battery industries.

4 Claims, 5 Drawing Sheets

APPARATUS OF REACTIVE CATHODIC ARC EVAPORATOR FOR PLATING LITHIUM-COMPOUND THIN FILM AND METHOD THEREOF

TECHNICAL FIELD OF THE INVENTION

The present invention relates to plating a lithium (Li)-compound thin film; more particularly, to omitting the preparation of a metallic oxide target and processing arc-plasma thin-film deposition to achieve the rate of depositing the metal oxide to about 6~16 times to that of the conventional radio frequency (RF) magnetron sputtering, where the production cost and time of a solid-state thin-film battery can be effectively reduced.

DESCRIPTION OF THE RELATED ARTS

Currently, many of the world's energy-related businesses invest in energy storage battery industries, famous ones including Tesla (United States, USA), BMW (China), Toyota (Japan), and so on. Likewise, companies like National (Japan), LG (Korea), Sharp (Japan), Sony (Japan), etc. invest in thin-film batteries. Today, the markets of wearable electronics and medical applications have great demand on thin-film battery energy storage systems; and, in particular, the world's largest economy, the USA, demands more. As revealed in a survey by Forrester Research in June 2014, it was found that Americans were interested in wearable devices at a ratio of 45 percent (%), which shows that the world's largest economy, the USA, will have a very amazing demand amount on wearable devices. This phenomenon also happens in some other countries, where millions of people use wearable smart devices and the number is rising fast. These countries are also actively developing such industries and the demand for the above-mentioned electronic products is very large, where the production of thin-film batteries is expected to grow several tens of folds.

Regarding related prior arts and patents, a first prior art discloses a method for enhancing the cycling life of the electrodes of the Li ion secondary battery. Therein, a vapor deposition for plating a film by using RF power is provided. A second prior art discloses a method of manufacturing a photovoltaic device. Therein, a photovoltaic device is fabricated with an enhanced photoelectric-conversion layer. A third prior art discloses an electrochromic device and a manufacturing method thereof. Therein, magnetron plasma plating and arc plasma deposition are used for fabricating an electrochromic film. U.S. Pat. No. 6,365,016B1 discloses a method and apparatus for arc plasma deposition with evaporation of reagents. The evaporated reactants are introduced into plasma and deposited on the surface of a substrate for obtaining an ultraviolet filter layer deposited on the polymeric substrate. In the above prior arts and patent, the first prior art is different from the present invention, while the others are independent of the present invention.

The conventional methods of making the positive electrode of Li thin-film battery or the solid-state electrolyte thin film use RF magnetron sputtering. Their targets are all metallic oxide targets, no matter lithium cobalt oxide ($LiCoO_2$), lithium manganese oxide ($LiMn_2O_4$) or lithium phosphorus oxide ($Li_3PO_4$). Such targets can produce stable plasmas by using RF power supply only. If a direct-current power supply is used, voltage collapse will occur to form arc discharge owing to the charge accumulated on the non-conductive oxide target. As a result, plasma becomes instable to further damage the target in local areas while the quality of the thin film is undermined. However, the RF magnetron sputtering is limited in very low sputtering efficiency, resulting in slow deposition rate. Typically, the rate of depositing the Li-compound oxide film through RF magnetron sputtering is about 3.3~8.3 nanometers per minute. In terms of depositing a lithium cobalt oxide thin film for a thickness of 3 micrometers, it is estimated to take as long as 6~16 hours. Because of this limitation of slow deposition rate, the production cost of lithium ion thin-film battery cannot be lowered down and makes this product not large-scale commercially produced.

Accordingly, only the conventional sputtering method of manufacturing a thin film is found, yet the deposition rate is slow and hinders mass production.

Hence, the prior arts do not fulfill all users' requests on actual use.

SUMMARY OF THE INVENTION

The main purpose of the present invention is to provide an apparatus to fabricate a composite Li-compound thin film by combining two thin-film fabrication methods of thermal evaporation and arc plasma deposition, where the preparation of a metallic oxide target in advance is not required and the method of radio frequency (RF) magnetron sputtering is abandoned owing to the slow fabricating rate.

Another purpose of the present invention is to greatly save time for plating and greatly enhance the rate of cell electrode fabrication for enormously reducing production cost and increasing production rate, where it is of great help to large-scale commercial production for solid-state Li thin-film battery industries; and, for example, it offers a great competitive edge to power supply of wearable devices.

To achieve the above purposes, the present invention is an apparatus of reactive cathodic arc evaporator for plating a Li-compound thin film, where the apparatus integrates thermal evaporation and arc plasma deposition; the apparatus comprises a plating chamber, a vacuum-system piping, an arc plasma source, an evaporated-material source, a gas supply source and a controller; within the plating chamber, a first shutter, a placing plate and a second shutter are allocated; the first shutter is corresponding to the placing plate; a substrate is placed on the placing plate; chemical vapor deposition is processed in the plating chamber to deposit a Li-compound thin film on the substrate; the vacuum-system piping is coupled to the deposition chamber to maintain a vacuum pressure required in the deposition chamber and discharge gases and byproducts from the deposition chamber after deposition is finished; the arc plasma source is disposed in the deposition chamber and is corresponding to the substrate; the arc plasma source has a metal target and is externally connected with a plasma power supply; the evaporated-material source is disposed in the deposition chamber and is corresponding to the second shutter; the evaporated-material source contains a Li metallic material and is externally connected with an evaporation power supply; the gas supply source is coupled to the deposition chamber to convey gas required during production into the deposition chamber; and the controller is disposed outside the deposition chamber and is coupled to the vacuum-system piping, the gas supply source, the evaporation power supply and the plasma power supply to control production sequence and adjust a vacuum pressure of the vacuum-system piping; a gas flow of the gas supply source; an evaporation source power of the evaporation power supply; and a plasma source power of the plasma power supply. Accordingly, a novel apparatus of reactive cathodic arc evaporator for plating a Li-compound thin film is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

Figure 1:
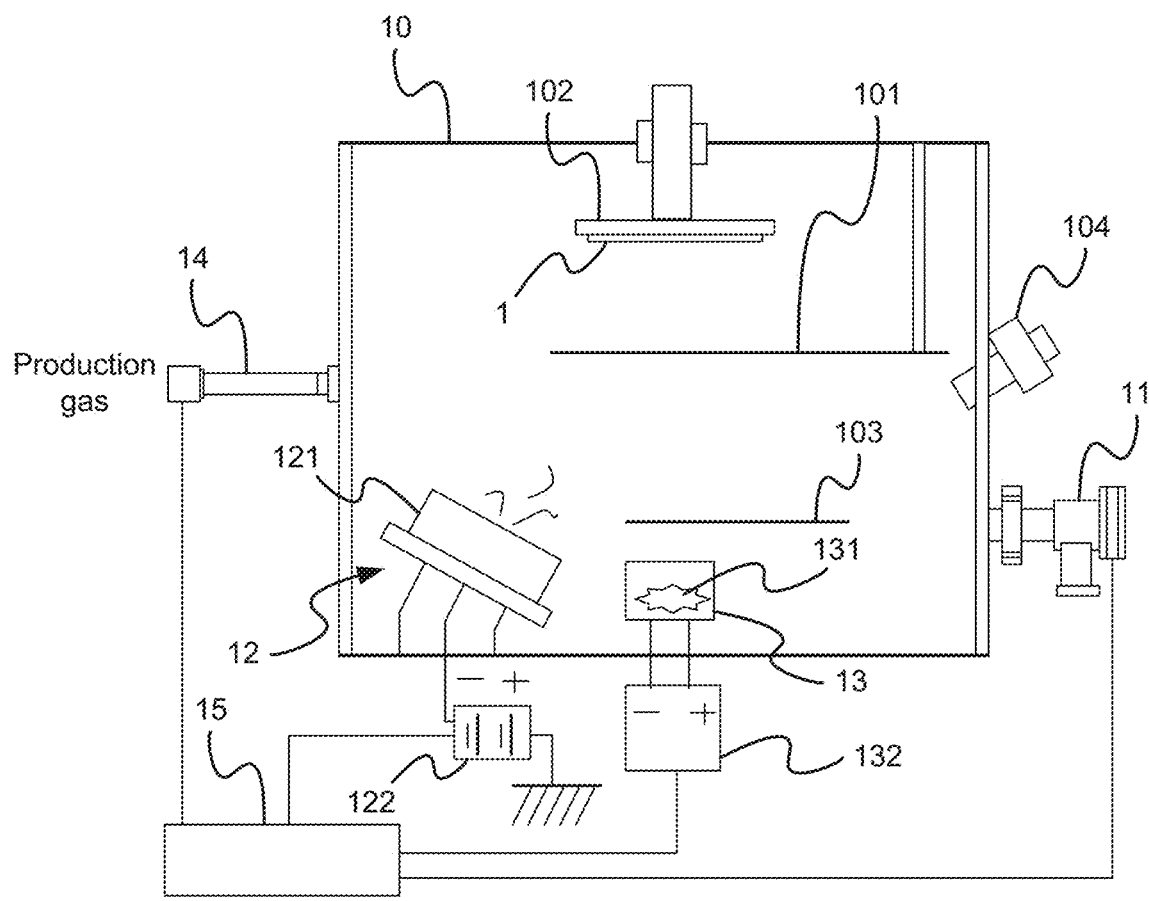
FIG. 1 is the view showing the preferred embodiment according to the present invention.

The following description of the preferred embodiment is provided to understand the features and the structures of the present invention.

Please refer to FIG. 1 to FIG. 5, which are a view showing a preferred embodiment according to the present invention; a flow view showing the fabrication of a Li-compound thin film; a sectional view showing a product; a view showing the charging/discharging curves of Li/Ti/O thin-film batteries; a view showing the cycling-characteristic curves of Li/Ti/O thin-film batteries. As shown in the figures, the present invention is an apparatus of reactive cathodic arc evaporator for plating a Li-compound thin film, comprising a deposition chamber 10, a vacuum-system piping 11, an arc plasma source 12, an evaporated-material source 13, a gas supply source 14 and a controller 15.

Within the plating chamber 10, a first shutter 101, a placing plate 102 and a second shutter 103 are allocated. A window port 104 is set on a side wall of the deposition chamber 10. The first shutter 101 is corresponding to the placing plate 102. A substrate 1 is placed on the placing plate 102. The plating chamber 10 is used to process chemical vapor deposition within to deposit a Li-compound thin film on the substrate 1.

The gas supply source 11 is coupled to the deposition chamber 10 to maintain a vacuum pressure required in the deposition chamber 10 and gases and byproducts are discharged after deposition is finished.

The arc plasma source 12 is set in the deposition chamber 10 and is corresponding to the substrate 1. The arc plasma source 12 is set with a metal target 121 and is externally connected with a plasma power supply 122.

The evaporated-material source 13 is set in the deposition chamber 10 and is corresponding to the second shutter 103. The evaporated-material source 13 contains a Li metallic material 131 and is externally connected with an evaporation power supply 132.

The vacuum-system piping 14 is coupled to the deposition chamber 10 to convey gas required, like argon or oxygen, into the deposition chamber 10 during production.

The controller 15 is set outside the deposition chamber 10 and is coupled to the vacuum-system piping 11, the gas supply source 14, the evaporation power supply 132 and the plasma power supply 122 to control production sequence and adjust a vacuum pressure of the vacuum-system piping 11; a gas flow of the gas supply source 14; an evaporation source power of the evaporation power supply 132; and a plasma source power of the plasma power supply 122 for further controlling the gases; the pressures; the required compositions and ratios of the components in the Li-compound thin film; and the deposition rate of the Li-compound thin film to achieve rapidly depositing the Li-compound thin film.

The metal target 121 is Ti, cobalt (Co) or manganese (Mn).

The present invention has a method of depositing the Li-compound thin film, which is characterized in that each component in the composition of the thin film can be independently generated according to required ratios for further combination and composition. Therein, the element of Li is generated by an independently-operated deposition system with the lithium metallic material through thermal evaporation; the element of Ti (or other metal element) is generated by another independently-operated arc plasma system with the metal target through arc evaporation; and oxygen molecules are independently added into the deposition chamber in the form of an oxygen gas. Each reactant of atoms or molecules independently adjusts its own yield according to a required amount and is excited and activated in the plasma environment of the deposition chamber 10 to process reaction and to be deposited on the substrate 1 in the end.

Figure 2:
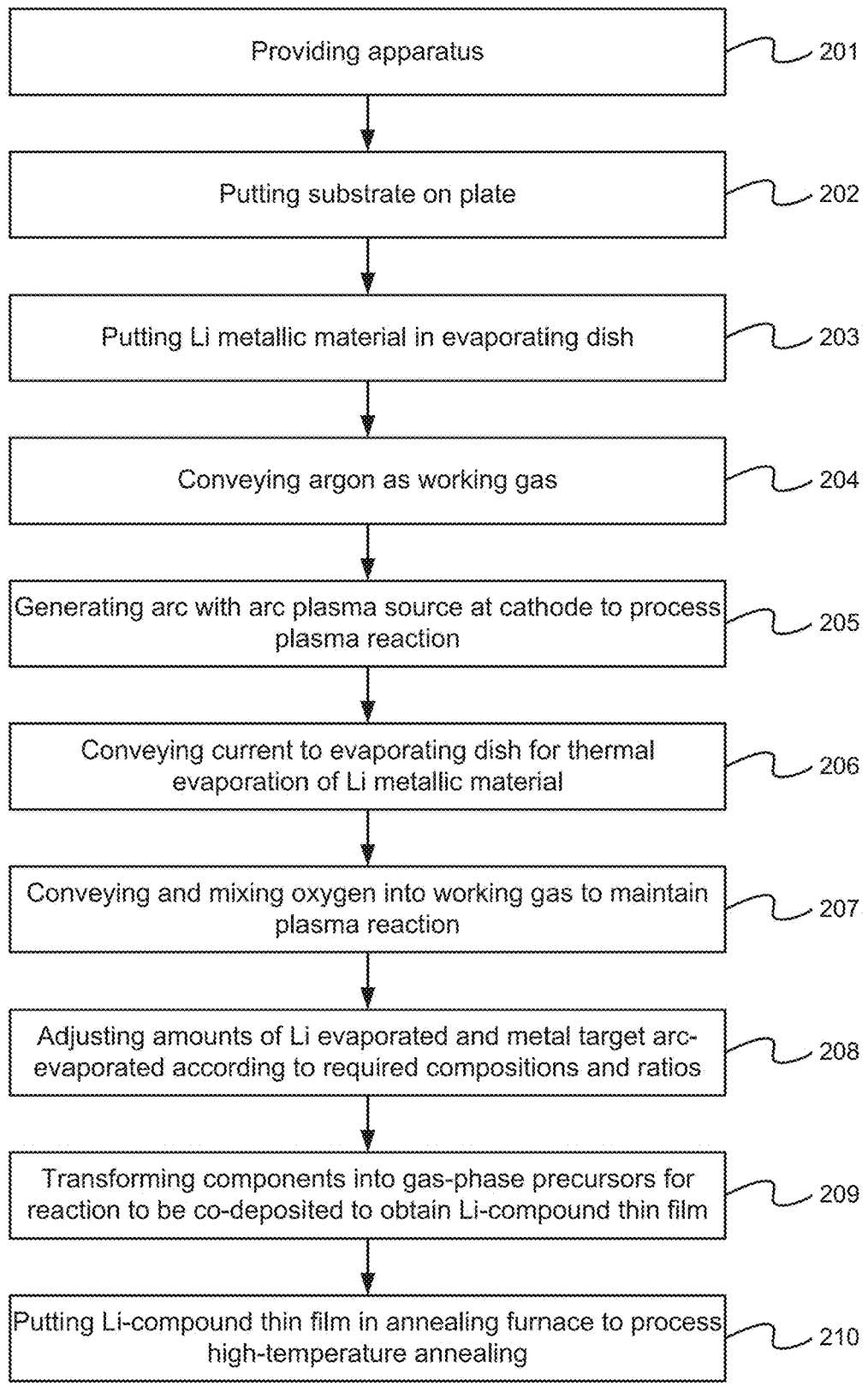
FIG. 2 is the flow view showing the fabrication of the lithium (Li)-compound thin film.
Figure 3:
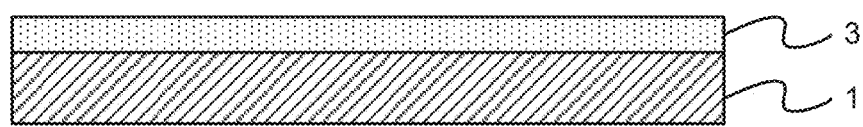
FIG. 3 is the sectional view showing the product.

Next, in FIG. 2, a flow view of a method of the present invention is shown: (a) In step 201, at first, the apparatus according to the present invention is provided. (b) In step 202, the substrate 1 is put on the placing plate 102. (c) In step 203, a weighed proper amount of the Li metallic material 131 is put in an evaporating dish (tungsten boat) of the evaporated-material source 13. (d) In step 204, argon is conveyed as the working gas in the deposition chamber 10 through the gas supply source 14. (e) In step 205, the plasma power supply 122 in the deposition chamber 10 is used to generate arc with the arc plasma source 12 at a cathode to process plasma reaction and hereinafter continuingly maintain the deposition chamber 10 in a stable status of a plasma environment thus formed. (f) In step 206, the evaporation power supply 132 in the deposition chamber 10 is used to convey a current to the evaporating dish of the evaporated-material source 13 to process thermal evaporation to the Li metallic material 131. (g) In step 207, after forming a molten state of a Li metal in the evaporating dish and keeping evaporating out a Li gas, the gas supply source 14 is used to convey and mix oxygen into the working gas (argon) to coordinately maintain the plasma reaction. (h) In step 208, under the stable status of the plasma environment, the controller 15 is used to adjust an amount of evaporated Li and an amount of the arc-evaporated metal target 121 according to required compositions and ratios, such as the amount of the material of metallic Ti. (i) In step 209, after the yield of each component of reactants including Li, Ti and oxygen is independently adjusted according to each corresponding required amount, each of the component is transformed into a gas-phase precursor to be excited and activated in the plasma environment of the deposition chamber 10 to process chemical reaction and all of the reactants are co-deposited on the substrate 1 to finally obtain the Li-compound thin film 3, as shown in FIG. 3. (j) In step 210, the Li-compound thin film 3 is put in a high-temperature annealing furnace to process high-temperature annealing under an atmospheric environment. Thus, the Li-compound thin film 3 obtains a good crystalline structure to be used as a cell electrode having a good charging/discharging feature.

Figure 4:
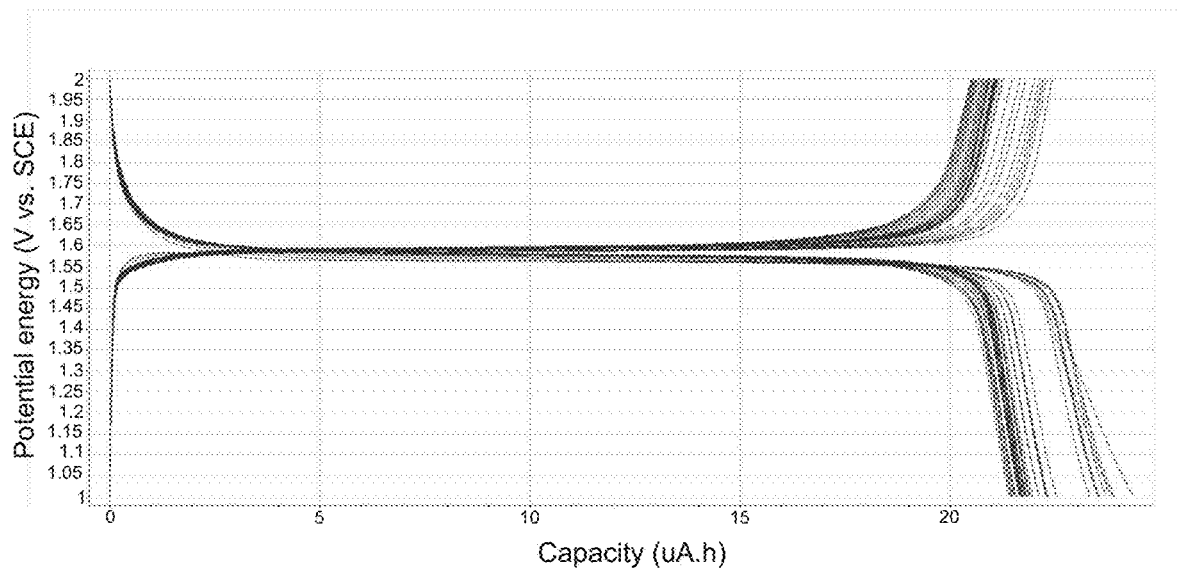
FIG. 4 is the view showing the charging/discharging curves of the Li/titanium (Ti)/oxygen (O) thin-film batteries.
Figure 5:
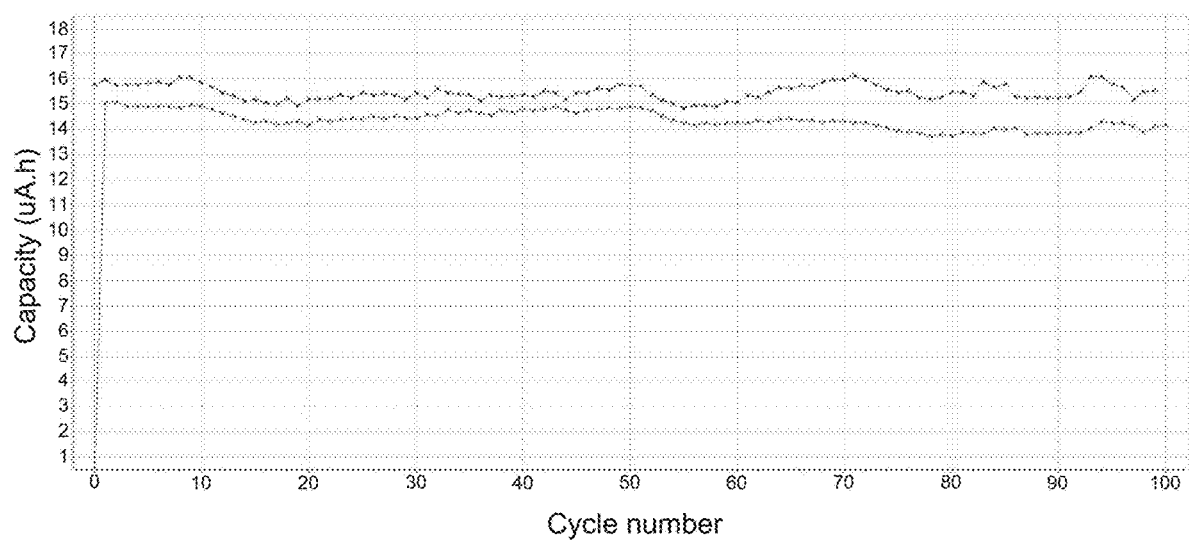
FIG. 5 is the view showing the cycling-characteristic curves of the Li/Ti/O thin-film batteries.

The apparatus according to the present invention has very stable and flat charging/discharging voltages, as shown in FIG. 4; and the battery has coulombic efficiencies still remained at ~100 percent after 100 cycles of charging and discharging, as shown in FIG. 5.

The present invention has the following advantages: (1) The preparation of a metallic oxide target, such as lithium cobalt oxide ($LiCoO_2$), lithium manganese oxide ($LiMn_2O_4$) or lithium phosphorus oxide ($Li_3PO_4$), in advance is not necessary. (2) The method of manufacturing a thin film through radio frequency (RF) magnetron sputtering is abandoned. Instead, thermal evaporation and an arc plasma method are combined to excite the material like Li, Ti, Co or Mn in a plasma environment to form excited atoms or molecules for further chemical reactions. Hence, the reaction efficiency is high with the deposition rate increased dramatically, which specifically improves the shortcomings of the conventional electrode plating method for Li thin-film batteries. Thus, the apparatus according to the present invention fast fabricates the Li-compound thin film through deposition. Not only the in-advance preparation of the metallic oxide target required in the conventional method is omitted; but also thin film is not obtained through the RF magnetron sputtering which is slow in fabrication. The present invention provides an apparatus of reactive cathodic arc evaporator for plating a Li-compound thin film, whose fabrication rate is about 6~16 times to that of the conventional RF magnetron sputtering. Therefore, the fabrication time for plating the Li-compound thin film is greatly saved with production cost reduced and production rate improved, which is of great help to large-scale commercial production for Li thin-film battery industries. This offers a great competitive edge to power supply of wearable devices, which can be applied to wearable electronics and small medical products.

To sum up, the present invention is an apparatus of reactive cathodic arc evaporator for plating a Li-compound thin film, where, for the different components of a Li compound, thermal evaporation and arc are used for the materials in the Li compound to be fast evaporated separately to become precursors of thin-film reactions and, in a plasma environment built by the system, the precursors are activated with gases added to process the chemical reactions for being further co-deposited on a substrate to form a Li-compound thin film in the end; and, regarding the applications in the Li thin-film battery industries, the apparatus according to the present invention greatly improves the fabrication rate of the thin film with production cost reduced as well.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method of plating said Li-compound thin film employing an apparatus of reactive cathodic arc evaporator for plating a lithium (Li)-compound thin film, the apparatus integrating thermal evaporation and arc plasma deposition, the apparatus comprising:

a deposition chamber comprising a first shutter, a placing plate, and a second shutter located within the deposition chamber; said first shutter corresponding to said placing plate; a substrate is placed on said placing plate; and chemical vapor deposition is processed in said deposition chamber to deposit a Li-compound thin film on said substrate;

a vacuum-system piping coupled to said deposition chamber to maintain a vacuum pressure required in said deposition chamber and gases and byproducts are discharged from said deposition chamber after deposition is finished;

an arc plasma source disposed in said deposition chamber corresponding to said substrate; and said arc plasma source has a metal target and is externally connected with a plasma power supply;

an evaporated-material source disposed in said deposition chamber corresponding to said second shutter; and said evaporated-material source contains a Li metallic material and is externally connected with an evaporation power supply;

a gas supply source coupled to said deposition chamber to convey gas into said deposition chamber required during production; and a controller disposed outside said deposition chamber and coupled to said vacuum-system piping, said gas supply source, said evaporation power supply, and said plasma power supply to control production sequence and to adjust a vacuum pressure of said vacuum-system piping, a gas flow of said gas supply source, an evaporation source power of said evaporation power supply, and a plasma source power of said plasma power supply, the method comprising steps of:

(a) obtaining the apparatus;

(b) disposing said substrate on said placing plate;

(c) obtaining and disposing an amount of said Li metallic material in said evaporated-material source;

(d) conveying argon as a working gas in said deposition chamber through said gas supply source;

(e) using said plasma power supply in said deposition chamber to generate an arc with said arc plasma source at a cathode to process a plasma reaction and hereinafter continuingly maintain said deposition chamber in a stable status of a plasma environment thus obtained;

(f) using said evaporation power supply in said deposition chamber to convey a current to said evaporated-material source to process thermal evaporation to said Li metallic material;

(g) after obtaining a molten state of a Li metal in said evaporated-material source and keeping evaporating out a Li gas, using said gas supply source to convey and mix oxygen into said working gas to coordinately maintain said plasma reaction;

(h) under said stable status of said plasma environment, using said controller to adjust an amount of evaporated Li and an amount of said arc-evaporated metal target according to required compositions and ratios;

(i) in accordance with a yield of each reactant including Li, said metal target and oxygen is independently adjusted according to each corresponding required amount of reactant, transforming said each reactant into a gas-phase precursor to be excited and activated in said plasma environment of said deposition chamber to process chemical reaction and co-depositing all of said reactants on said substrate to finally obtain said Li-compound thin film; and (j) disposing said Li-compound thin film in an annealing furnace to process annealing under an atmospheric environment to obtain said Li-compound thin film having a crystalline structure to be used as a cell electrode.

2. The method according to claim 1, wherein the yield of Li is controlled by said controller through adjusting an evaporating rate of Li in said evaporated-material source.

3. The method according to claim 1, wherein the yield of said metal target is controlled by said controller through adjusting a current intensity of said arc plasma source.

4. The method according to claim 1, wherein oxygen is adjusted by said controller to be mixed with said working gas as a reaction gas at a determined ratio to maintain said plasma environment.

\* \* \* \* \*